(12) United States Patent
von Fragstein et al.

(10) Patent No.: US 11,897,208 B2
(45) Date of Patent: Feb. 13, 2024

(54) COMPOSITE MATERIAL WITH ADHESION PROMOTER LAYER BASED ON SI, C AND O

(71) Applicant: Carl Freudenberg KG, Weinheim (DE)

(72) Inventors: Friederike von Fragstein, Heidelberg (DE); Albin Marksteiner, Langkampfen (AT); Roman Christopher, Brannenburg (DE); Stephan Rutz, Weinheim (DE); Katharina Hallstein, Fuerth/Kroeckelbach (DE); Kai Feller, Bolanden (DE); Yvonne Fetsch, Huettenfeld-Lampertheim (DE); Matthias Adler, Heppenheim (DE)

(73) Assignee: CARL FREUDENBERG KG, Weinheim (DE)

(*) Notice: Subject to any disclaimer, the term of this patent is extended or adjusted under 35 U.S.C. 154(b) by 574 days.

(21) Appl. No.: 16/737,946

(22) Filed: Jan. 9, 2020

(65) Prior Publication Data
US 2020/0223152 A1    Jul. 16, 2020

(30) Foreign Application Priority Data

Jan. 11, 2019  (EP) ..................................... 19151316
Dec. 17, 2019  (EP) ..................................... 19217042

(51) Int. Cl.
*C09J 183/04*    (2006.01)
*B29C 65/52*    (2006.01)
(Continued)

(52) U.S. Cl.
CPC ............ *B29C 65/528* (2013.01); *B29C 35/02* (2013.01); *B29C 65/483* (2013.01);
(Continued)

(58) Field of Classification Search
CPC ..... B29C 65/528; B29C 35/02; B29C 65/483; B29C 66/74283; B32B 27/283;
(Continued)

(56) References Cited

U.S. PATENT DOCUMENTS

| 4,649,071 A | 3/1987 | Tajima |
| 2009/0053526 A1* | 2/2009 | Arita ...................... B32B 27/00 428/411.1 |

(Continued)

FOREIGN PATENT DOCUMENTS

| DE | 19856227 A1 | 6/2020 |
| EP | 0317134 A2 | 5/1989 |

(Continued)

*Primary Examiner* — Michael B Nelson
(74) *Attorney, Agent, or Firm* — LEYDIG, VOIT & MAYER, LTD.

(57) ABSTRACT

A composite material includes: a substrate and a polymer layer which are interconnected by an adhesion promoter layer. The adhesion promoter layer is obtainable by plasma-enhanced chemical vapor deposition (PE-CVD) at least partially using a mixture of precursor compounds containing an unsaturated hydrocarbon and an organosilicon compound. In an embodiment, the substrate includes a metal substrate or a polymer substrate.

18 Claims, 2 Drawing Sheets

(51) Int. Cl.
  *B29C 35/02* (2006.01)
  *B29C 65/48* (2006.01)
  *B29C 65/00* (2006.01)
  *B32B 27/28* (2006.01)
  *B32B 9/04* (2006.01)

(52) U.S. Cl.
  CPC ...... *B29C 66/74283* (2013.01); *B32B 27/283* (2013.01); *C09J 183/04* (2013.01); *B32B 9/045* (2013.01); *C09K 2323/053* (2020.08); *Y10T 428/265* (2015.01); *Y10T 428/31536* (2015.04); *Y10T 428/31663* (2015.04)

(58) Field of Classification Search
  CPC ......... B32B 9/045; B32B 15/06; B32B 15/08; B32B 25/08; B32B 7/12; B32B 25/18; B32B 9/005; B32B 9/043; B32B 15/18; B32B 15/20; B32B 25/14; B32B 25/16; B32B 25/20; B32B 27/38; B32B 27/40; B32B 2255/06; B32B 2255/10; B32B 2255/24; B32B 2307/732; B32B 2581/00; B32B 27/08; C09J 183/04; C09K 2323/053; C09K 3/10; Y10T 428/265; Y10T 428/31663; C23C 16/30; C23C 28/00; C23C 16/26; C23C 16/45523; C23C 16/505; C23C 16/50; C23C 16/401; B05D 2202/15; B05D 2451/00; B05D 7/14; B05D 1/62; B05D 1/36
  See application file for complete search history.

(56) References Cited

U.S. PATENT DOCUMENTS

| | | | |
|---|---|---|---|
| 2009/0220794 A1* | 9/2009 | O'Neill | C23C 4/18 428/447 |
| 2011/0148050 A1 | 6/2011 | Vissing | |
| 2012/0315472 A1 | 12/2012 | Yamakawa et al. | |
| 2016/0049609 A1* | 2/2016 | Ezure | C23C 16/325 427/547 |
| 2019/0152195 A1* | 5/2019 | Inoue | B32B 27/18 |

FOREIGN PATENT DOCUMENTS

| | | |
|---|---|---|
| EP | 0590467 A1 | 4/1996 |
| EP | 2135734 A1 | 12/2009 |
| JP | 2018177845 A | 11/2018 |
| WO | 0138596 A2 | 5/2001 |
| WO | 0161069 A2 | 8/2001 |
| WO | 03005429 A1 | 1/2003 |
| WO | 2010089333 A1 | 8/2010 |

* cited by examiner

COMPOSITE MATERIAL WITH ADHESION PROMOTER LAYER BASED ON SI, C AND O

CROSS-REFERENCE TO PRIOR APPLICATION

Priority is claimed to European Patent Application No. EP 19 217 042.1, filed on Dec. 17, 2019, and to European Patent Application No. EP 19 151 316.7 filed on Jan. 11, 2019. The entire disclosures of the foregoing applications are hereby incorporated by reference herein.

FIELD

The invention relates to a composite material comprising the substrate and a polymer layer which are interconnected by an adhesion promoter layer. The invention also relates to methods for producing the composite materials, sealing articles and uses.

BACKGROUND

Composite materials are materials made of different interconnected materials whose material properties are combined. They often consist of layers of different, interconnected materials. Composite materials are used, among other things, to provide a substrate with other properties at the surface. For example, composite materials made of metals and polymers which have a high degree of hardness through the metal component and a high elasticity at a polymer surface are known. In other composite materials, various plastics having different properties are advantageously combined.

In the case of composite materials, the fundamental problem is that the various materials must be permanently and stably interconnected, for which purpose binders are generally used. This is particularly problematic if the components have very different physical and chemical properties. This may be the case when connecting metals and elastomers, but also when connecting different plastics. The stability of composite materials consisting of such different components is often in need of improvement, because the binder routinely establishes a less stable bond with one of the components.

In general, the layers of such composite materials are firmly bonded in the prior art, for example by gluing or welding. The surfaces of the layers can also be activated for better bonding, for example by chemical reaction with a primer. Adhesion promoter layers can be used to connect poorly compatible materials. Such adhesion promoter layers are often produced by applying wet-chemical primers or binders, for example those consisting of solutions or melts. With such methods, a workpiece to be coated is often provided with a binder in an immersion bath or spray process and is subsequently provided with the outer layer of a second material component. For example, seal rings are usually produced by coating a metal ring with a binder in an immersion bath or spray process, removing it, and providing it by injection molding with an elastomeric material component which partially or completely encloses the metal ring. With such methods, it is disadvantageous that wet-chemical processes consume a large amount of binder, which in part cannot be used for process-related reasons, which is undesirable for ecological and also economic reasons.

Composite materials made of components with very different properties are particularly important in the field of sealing technology. In this case, for example, very hard, stable components are combined with elastic materials which, among other things, enable a positively locking, sealing connection. Composite materials made of hard base materials and elastomers are also used in sealing technology in order to provide the base materials with further properties, such as a high degree of stability against abrasion, good wettability with sealants or good tribological properties.

In the prior art, plasma-enhanced methods are also used for the production of composite materials. In this case, an adhesion promoter layer can be applied to a substrate by plasma-enhanced chemical vapor deposition (PE-CVD) and is subsequently connected to a further layer. However, the stability of such composite materials is often still in need of improvement.

For example, WO 01/61069 A2 describes methods for the production of composite materials from plastic and metal, with which a carbon-rich layer is applied to a metal substrate by means of PE-CVD. In this case, acetylene is used as the precursor compound in the plasma. It is known that by deposition of acetylene in plasma, highly crosslinked amorphous carbon layers are obtained, which are also referred to as diamond-like carbon (DLC). It is also proposed in this respect to connect such metal substrates coated with carbon in plasma to plastics. However, adhesion promoter layers made of DLC which consist substantially of carbon, hydrogen and optionally also small proportions of oxygen have various disadvantages. For example, the bonding to many substrates, in particular metallic substrates, and first and foremost to stainless steel, is often insufficient. It is also disadvantageous that DLC layers have relatively high residual stress, which can reduce layer stability and adhesion. This may cause such DLC layers to flake off the substrate. The stability of such composite materials with DLC layers is therefore still in need of improvement.

Further composite materials with adhesion promoter layers produced in plasma are described in WO 01/38596 A2. In this respect, it is proposed to provide metallic substrates with an adhesion promoter layer which is produced as precursor compounds from an oxidizing gas and organosilicon compounds, such as hexamethyldisiloxane (HMDSO), which are not tetramethylsilane. The substrate provided with the adhesion promoter layer is subsequently provided with an organic coating, which is preferably a lacquer. In particular, a coil coating lacquer is used and burnt in. The method is disadvantageous in that such coatings made of HMDSO have a high proportion of Si and O, resulting in a $SiO_2$-like structure with a high degree of hardness. The bonding of such relatively hard substrates to other materials, such as elastomers, is often not very stable and in need of improvement.

DE 198 56 227 A1 relates to methods for activating surfaces fluoropolymers of low surface energy, such as PTFE (Teflon). The inert surface is thereby to be provided with functional groups. The fluoropolymers activated in plasma can be used for the production of material composites which are produced, for example, by metallization or gluing. A plurality of precursor compounds is proposed as process gas for plasma activation in order to produce various functional groups at the surface. In the exemplary embodiments, the PTFE substrate is modified in plasma with ammonia or with HMDSO as process gas. The intermediate thus activated is subsequently glued to a metal foil using an adhesive. This is disadvantageous in that the stability of such glued composite materials consisting of different materials is often insufficient. Generally, the methods are specifically suitable for inert PTFE and the product is comparatively unreactive. The described methods and composite materials are therefore still in need of improvement.

US 2012/0315472 A1 discloses composite materials consisting of a plastic or metal substrate and an adhesion promoter layer produced in plasma with acetylene. In this case, a hard DLC layer is obtained, which is coated with a polymer compound and cured by means of vulcanization. This is disadvantageous in that the stability of the composite materials is in need of improvement because of the hardness of the DLC layer.

EP 0 317 134 A2 describes methods with which a substrate is provided with an abrasion-resistant coating. The coating is deposited in plasma in the presence of silanes, alkenes and an oxygen source as precursor compounds. Given their high degree of stability, the coated materials are to be suitable for various applications, for example for windows or wind shields. Further processing the coated materials is not disclosed.

Abrasion-resistant coatings are also disclosed in EP 0 590 467 A1. In this case, coatings based on organosilanes or organosiloxanes are produced by means of PE-CVD, wherein unsaturated hydrocarbons can be added. The coated products are to be scratch-resistant and suitable as acrylic glasses. Further processing the coated plastics is not disclosed.

JP 2018 177845 A relates to adhesion promoter layers for fluoropolymers produced by chemical vapor deposition from organosilicon compounds, such as HMDSO. Mixing mixtures of the organosilicon compounds with other precursor compounds is not disclosed.

WO 03/005429 A1 relates to coatings which have a low dielectric constant. The coatings are applied as films to electronic devices. Production takes place by means of chemical vapor deposition from mixtures of unsaturated hydrocarbons and organosilicon compounds. Metallic surfaces, such as platinum surfaces, are used as substrates. The document does not relate to the bonding of materials by adhesion promoter layers.

There is a continuous need in the prior art for improved composite materials with which layers of different materials are stably interconnected.

SUMMARY

In an embodiment, the present invention provides a composite material, comprising: a substrate and a polymer layer which are interconnected by an adhesion promoter layer, wherein the adhesion promoter layer is obtainable by plasma-enhanced chemical vapor deposition (PE-CVD) at least partially using a mixture of precursor compounds containing an unsaturated hydrocarbon and an organosilicon compound.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIG. 2b shows the component with the stable elastomer layer (dark, central). FIG. 2a shows that the elastomer largely detaches from the light-colored, central base body.

DETAILED DESCRIPTION

Figure 1A:
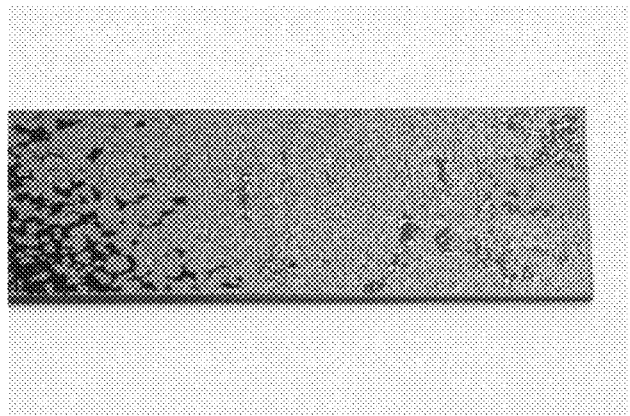
FIGS. 1a and 1b show photographs of the coatings on stainless steel base bodies according to Comparative Example 1 (FIG. 1a) and Example 2 (FIG. 1b). In Comparative Example 2, the unstable dark coating has largely detached from the light-colored stainless steel substrate. In contrast, Example 2 shows a stable dark coating.

The invention is based on the object of providing composite materials, methods and uses which solve the problems described above. In particular, the object of the invention is to provide methods and composite materials which enable a stable connection of different materials.

The invention is based in particular on the problem of stably interconnecting metals with polymers or various polymers. In particular, there is the problem of stably connecting rigid materials, such as metals or rigid plastics, to soft materials, such as elastomers.

The composite materials should preferably be obtainable from conventional components and with relatively simple methods in a few steps. The methods should consume as little material as possible and thereby be as economical and environmentally friendly as possible.

The invention is furthermore based on the object of providing adhesion promoter layers which adhere well to a plurality of different, in particular rigid, substrates and, in particular, enable a stable connection to a plurality of further, different materials in the process.

The object underlying the invention is surprisingly achieved by composite materials and methods as described herein.

The invention relates to a composite material comprising a substrate and a polymer layer which are interconnected by an adhesion promoter layer, wherein the adhesion promoter layer is obtainable by plasma-enhanced chemical vapor deposition (PE-CVD), at least partially using a mixture of precursor compounds containing an unsaturated hydrocarbon and an organosilicon compound.

The term "substrate" refers to a molded body coated with the polymer layer. The substrate is connected to the polymer layer by the adhesion promoter layer. The adhesion promoter layer is formed on the substrate in plasma. Thus, the adhesion promoter layer to which the polymer layer is applied is applied to the surface of the substrate, or a part thereof. The composite material thus has three stacked components (layers) which are interconnected in a planar manner. The substrate is coated on the surface with the polymer layer. In order to clarify the planar connection at the surface of the substrate, the composite material may also be described such that the substrate is referred to as a "substrate layer." The "substrate layer" is thus the substrate itself and not a part of the substrate or a different or additional component.

The composite material thus has at least three components (layers). The components (layers) are interconnected in a planar and stable manner. In this case, the substrate, i.e., the region at the surface of the substrate or the substrate layer, is connected to the polymer layer via the adhesion promoter layer. This means that no further layers are present between the adhesion promoter layer and the substrate, i.e., the surface of the substrate or of the substrate layer, and between the adhesion promoter layer and the polymer layer.

The composite material can have further layers on the side of the substrate or of the polymer layer facing away from the adhesion promoter layer in each case. The three components, or layers, of the composite material are firmly bonded to one another. The adhesion promoter layer is preferably covalently bonded to the polymer layer, wherein the bonding takes place in particular by a crosslinking reaction. The substrate is preferably also covalently bonded to the adhesion promoter layer.

Surprisingly, it was found that an adhesion promoter layer which forms a stable and durable bond with a plurality of substrates can be obtained from unsaturated hydrocarbons in conjunction with organosilicon compounds in the PE-CVD method. According to the invention, this coating produced in plasma serves as adhesion promoter layer.

In this case, the substrate can in principle consist of any material which can be provided in plasma with a coating based on Si, C, O and H. For example, the substrate may be a metal substrate, a polymer substrate (plastic substrate) or a ceramic substrate. The substrate itself may also be a composite material. For example, the substrate may be a polymer substrate containing fillers, fibers or other components, or a complex component consisting of several components and having a suitable surface to be coated. Preferably, the substrate is a metal substrate or a polymer substrate. The substrate can be coated completely or locally by, for example, covering areas of the surface that are not to be coated when applying the adhesion promoter layer and/or the polymer layer.

In a particularly preferred embodiment, the substrate is a metal substrate. In plasma, metals can be provided particularly efficiently with coatings based on Si, C, O and H. In this case, conventional substrates for composite materials can be used. The metal is preferably selected from steel, in particular stainless steel, iron, aluminum, silicon or brass.

In another preferred embodiment, the substrate is a polymer substrate (plastic substrate). In this case, the polymer forms a matrix. Preferably, the polymer is a thermoplast or thermoset. Suitable polymers are, for example, thermoplasts, such as polyolefins (polypropylene, polyethylene), polyamides, polyesters (such as polybutylene terephthalate), polyphenylene sulfides or fluoropolymers, such as polytetrafluoroethylene, polyvinylidene fluoride, perfluoroalkoxy polymers or mixtures of such polymers. Fiber-reinforced or particle-reinforced materials based on these polymers may also be used in this case. In general, the polymer matrix may contain customary additives, in particular fillers. Such polymers have sufficient strengths to be provided in plasma with coatings based on Si, C and O.

The substrate may also be an inorganic substrate, in particular made of metal, ceramic, glass or oxides of metals or semimetals, such as silica. A substrate made of metal is particularly preferred in this respect.

The adhesion promoter layer is obtainable by plasma-enhanced chemical vapor deposition (PE-CVD). The adhesion promoter layer is applied to the substrate by means of PE-CVD. The connection to the polymer layer takes place only after completion of the plasma process. The adhesion promoter layer contains the elements Si, C, O and H. Since the structure is in this case characterized by Si, C and O, while the H atoms are attached terminally to the other elements, the adhesion promoter layer is also referred to in the context of this application as an adhesion promoter layer based on Si, C and O. The adhesion promoter layer may also contain additional elements, such as N or halogen, such as Cl or F.

Methods for producing coatings on substrates by means of PE-CVD are known and described in the prior art. Reference is merely made by way of example to the publications discussed in the introduction. In general, coatings are obtained in plasma from Si, C, O and H if gaseous or vaporous precursor compounds having Si, C, O and H atoms are added to the plasma. The precursor compounds are activated in plasma and form crosslinked layers on the substrate surface. The term "precursor compound" refers to compounds whose constituents contribute to layer growth. Carrier gases or inert gases which may additionally be present in the mixture are therefore not precursor compounds. Plasma coatings differ significantly from coatings which have comparable compositions and are obtained, for example, by means of conventional polymerization methods and crosslinking methods. Plasma coatings form characteristic, non-stoichiometric structures which are not readily describable by a chemical formula.

The adhesion promoter layer is obtained by a PE-CVD process at least partially using a mixture of precursor compounds containing at least one unsaturated hydrocarbon and at least one organosilicon compound. Thus, two, three or more different unsaturated hydrocarbons and/or two, three or more organosilicon compounds may also be contained in the mixture. The mixture preferably contains no additional precursor compounds and/or no additional precursor compounds are used in the PE-CVD.

Surprisingly, it was found that a particularly stable, adhesive connection can be achieved with such a mixture of precursor compounds. In particular, the stability of the composite materials is significantly higher than that of comparable composite materials with which the adhesion promoter layer is produced only from unsaturated hydrocarbons or only from an organosilicon compound.

According to the invention, adhesion promoter layers which combine the advantageous properties of DLC coatings and Si-containing coatings can be produced. DLC (diamond-like carbon) is a carbon-based material which has high degrees of hardness and stability and which is obtainable, for example, by means of PE-CVD. In a preferred embodiment, the adhesion promoter layer forms a structure with which the carbon atoms are essentially arranged as in a DLC layer without silicon. The layer is therefore approximately similar to a DLC layer doped with silicon. In general, however, it should be noted that an exact structure of layers produced by means of PE-CVD can be determined only with difficulty or approximately. Since a plurality of reactive radicals, ions, neutral particles and compounds can react and be deposited in a multitude of ways in plasma, plasma layers have no precisely defined structures at the molecular level. For example, the coatings may have carbon double bonds, carbon triple bonds or radical groups. It is therefore customary and also expedient in the technical field to characterize plasma coatings by means of the precursor compounds.

According to the invention, it is preferred that a substantial portion of the Si atoms in the adhesion promoter layer dopes the DLC structure, which means that C atoms in the DLC structure are replaced by Si atoms. Preferably, at least 20%, at least 40% or particularly preferably more than 60% of the Si atoms are present as doping in the DLC structure.

The hybridization states of the C atoms and the positions of the Si atoms can be determined spectroscopically. In one embodiment, a substantial proportion of the carbon atoms are sp2 hybridized in the adhesion promoter layer. Thus, at least 20%, preferably at least 40% or in particular at least 60% of the carbon atoms can be sp2 hybridized. The proportion of sp2 hybridized carbon can be between 20% and 90%, in particular between 40% and 80%. The proportion of sp2 hybridized carbon can be determined by Raman spectroscopy.

In the context of this application, "organosilicon compound" means that the compound contains Si, C, H and optionally O. The compound may contain additional elements, such as N or halogens. The organosilicon compound is preferably a low-molecular, i.e., non-polymeric, compound. The organosilicon compound is preferably a siloxane, a silane or a silicate.

Siloxanes are chemical compounds of the general formula R3Si—[O—SiR2]n-O—SiR3, wherein the residues R may be hydrogen atoms or alkyl groups. In contrast to silanes, the silicon atoms are not linked directly but through an oxygen atom to their adjacent silicon atom. They thus have Si—O—Si groups. Siloxanes R=CH3 are called polydimethylsiloxanes.

The siloxanes preferably have 2 to 6 silicon atoms. The siloxane is particularly preferably selected from hexamethyldisiloxane (HMDSO), disiloxane or octamethyltrisiloxane. It was found that such precursor compounds are particularly suitable for the production of adhesion promoter layers with unsaturated hydrocarbons as further precursor compounds.

In one preferred embodiment, the siloxane is HMDSO. HMDSO is frequently used in its physical and chemical properties for the production of silicon-containing coatings in plasma. In addition, HMDSO reacts well with unsaturated hydrocarbons in plasma, in particular with ethylene or acetylene.

According to the IUPAC rules, the term "silanes" refers to a substance group of chemical compounds which consist of a silicon skeleton and hydrogen. Silanes may have a branched (iso-silanes and neo-silanes) or unbranched (n-silanes) structure. The general molecular formula of the non-cyclic (open-chain) silanes is Sin H2n+2. Ring-shaped silicon-hydrogen compounds are referred to as cyclosilanes (general molecular formula: Sin H2n).

The silane preferably has 1 to 6 silicon atoms, particularly preferably 1 to 3 silicon atoms, as precursor compound. In particular, the silane is selected from tetramethylsilane (TMS), disilane (Si2H6) or trisilane (Si3H8).

The silane is particularly preferably tetramethylsilane (TMS). Methods for producing plasma coatings with TMS are known in the art. Given its physical and chemical properties, TMS is particularly suitable for producing plasma coatings. It is suitable for producing adhesion promoter layers, even in mixtures with unsaturated hydrocarbons.

In a further embodiment, the organosilicon compound is a silicate, in particular tetraethyl orthosilicate (TEOS, also referred to as tetraethoxysilane).

Unsaturated hydrocarbons are compounds of C and H which have at least one double bond or triple bond. In this case, aliphatic hydrocarbons are in particular used according to the invention. Alkenes or alkynes are particularly preferred. Alkenes or alkynes which have 2 to 8 carbon atoms, in particular 2 to 6 carbon atoms, are preferably used in this case. For example, the unsaturated hydrocarbon may be selected from ethylene (ethene) propene, butene, pentene, hexene, cyclohexene, propylene or butylene, or from acetylene (ethyne), propyne or butyne.

In a preferred embodiment, the unsaturated hydrocarbon is ethylene or acetylene. Ethylene and acetylene are particularly suitable for the production of plasma coatings because of their physical and chemical properties. Acetylene is particularly preferably used. If acetylene is used with a silicon-containing precursor compound for the production of plasma adhesion promoter layers, a strong bond can be produced. Without being bound to a theory, this could be due to the fact that such an adhesion promoter layer has, at the surface, a relatively high proportion of unsaturated groups which can be crosslinked with the polymer layer. In addition, the surfaces of such plasma coatings often contain polar functional groups, such as carbonyl groups or carboxyl groups, which are formed by subsequent reactions, for example by reaction of radicals in the plasma coating with atmospheric oxygen, and are likewise available for further reactions. Radicals in the plasma coating could also react with the polymer layer.

The adhesion promoter layer may have an essentially homogeneous structure or a heterogeneous structure and/or composition. The composition of the layer can vary in particular over the thickness of the layer. A homogeneous structure can be obtained if the process conditions, and the composition of the mixture of the precursor compounds as well, are kept constant during the PE-CVD. A heterogeneous structure can be obtained if the process conditions and in particular the composition of the mixture of the precursor compound are changed during the coating in plasma.

During the PE-CVD, the mixture of precursor compounds containing an unsaturated hydrocarbon and an organosilicon compound is at least partially used. With such PE-CVD processes, the type and amount of precursor compounds can be changed during the reaction. This usually takes place via the supplied gas flow. In this context, "partial" means that the PE-CVD can be guided such that a portion of the adhesion promoter layer is not produced from a mixture containing an unsaturated hydrocarbon and an organosilicon compound. This may be advantageous in order to produce gradient layers, for example.

In a preferred embodiment, a mixture of precursor compounds containing an unsaturated hydrocarbon and an organosilicon compound is used to produce a part of the adhesion promoter layer, wherein another part of the adhesion promoter layer is produced only from unsaturated hydrocarbons and/or organosilicon compound.

In a preferred embodiment, the plasma reaction is carried out exclusively with unsaturated hydrocarbons and organosilicon compounds as precursor compounds.

In a preferred embodiment, the adhesion promoter layer is formed as a gradient layer. The gradient may be a continuous gradient or a step gradient. In order to produce a continuous gradient, the composition of the precursor compounds can be changed continuously during the plasma process. In order to produce a step gradient, the composition of the precursor compounds can be modified in steps. A gradient layer may also be produced if the concentration of the mixture remains the same but other substantial process parameters, such as power, are changed.

In this case, forming a gradient which leads to improved adhesion on the two sides of the adhesion promoter layer is preferred. In this case, the proportion of carbon in the gradient layer preferably increases toward the polymer layer and the proportion of Si decreases toward the polymer layer. This is advantageous because an adhesion promoter layer with a relatively high carbon content can often enter into a particularly strong bond with the polymer layer. This embodiment is particularly preferred if an inorganic substrate is used, for example a metal substrate. Metals can often enter relatively strong connections with adhesion promoter layers with a relatively high Si content. It is particularly preferred that a lower part of the adhesion promoter layer is first produced on the substrate, which is in particular a metal, wherein only organosilicon compound is used as precursor compound, after which an upper part of the adhesion promoter layer is produced thereabove from the mixture of precursor compounds containing an unsaturated hydrocarbon and an organosilicon compound.

Particular preference is given to a method with which an adhesion promoter layer with HMDSO or TMS and acetylene or ethylene as precursor compounds is produced, wherein the proportion of HMDSO or TMS in the precursor compounds decrease during the process and/or wherein the proportion of acetylene or ethylene in the precursor compounds increase during the process. The substrate is preferably an inorganic substrate, in particular a metal substrate, or a non-fluorine-containing polymer substrate.

In a preferred embodiment, the adhesion promoter layer has a thickness of 30 nm to 10 µm. In general, it is preferred that the adhesion promoter layer has as low a thickness as possible, while at the same time bringing about a stable connection of the substrate to the polymer layer.

With such reactions in plasma, the amounts and ratios of the precursor compounds are usually adjusted via the volume flow. In a preferred embodiment, the plasma reaction is carried out in such a way that the ratio of the volume flows of the unsaturated hydrocarbons and organosilicon compounds is 20:1 to 1:20, preferably 5:1 to 1:5, and in particular 2:1 to 1:2 (in standard cubic centimeters, sccm). In a further embodiment, the mixture of precursor compounds contains unsaturated hydrocarbons and organosilicon compounds in a weight ratio of 5:1 to 1:5, in particular in the ratio of 2:1 to 1:2.

Preferably, the mixture used in the PE-CVD process contains exclusively unsaturated hydrocarbons and organosilicon compounds as precursor compounds. The mixture in particular preferably consists of a hydrocarbon selected from ethylene or acetylene and a silicon compound selected from HMDSO or TMS. According to the invention, it was found that an adhesion promoter layer with strong bonding effect can be obtained if only these reactive precursor compounds are used. In this way, the adhesion promoter layer can be easily produced from readily available and manageable precursor compounds, wherein a relatively homogeneous adhesion promoter layer can be obtained.

In a preferred embodiment, the PE-CVD process is not carried out in the presence of an additional oxygen source, such as O2, H2O or N2O. EP 0 317 134 A2 proposes producing coating in plasma with silanes, alkenes and an additional oxygen source in order to obtain a high degree of hardness. According to the invention, it was found that a high degree of stability can be achieved without using an additional oxygen source.

Preferred compositions of the adhesion promoter layer are described below. In a preferred embodiment, at least the surface of the adhesion promoter layer has the respective composition. In this case, the composition of the adhesion promoter layer at the surface, in particular up to a depth of 10 nm, can be determined easily by means of XPS. The composition at the surface is of particularly high importance for bonding to the polymer layer. In a further embodiment, the adhesion promoter layer overall has the aforementioned composition.

The proportions in at. % indicated here and below for the elements Si, O and C are preferably determined by means of XPS. In this case, the proportion of H cannot be detected by means of XPS. The remainder of the weight preferably consists of H, and optionally additional elements, such as N, halogen, such as F or Cl, or metals, such as Fe. In this case, the remainder preferably consists of hydrogen and optionally additional elements from the substrate. It is known that, with such methods in plasma, atoms or molecules can detach from the substrate surface and pass into the plasma coating. In the case of coatings on stainless steel, a small proportion of Fe can often be detected in the coating and, in the case of coatings on fluorine-containing polymers, a proportion of fluorine can often be detected in the coating.

The proportion of Si+C+O at the surface of the adhesion promoter layer and/or of the adhesion promoter layer as a whole is preferably >90 at. %, in particular >95 at. % or >98 at. %.

The surface of the adhesion promoter layer and/or the adhesion promoter layer as a whole preferably have a relatively low proportion of Si, which is in particular <25 at. % or <20 at. %. It is preferred that the proportion of Si is between 3 at. % and 25 at. %, in particular between 4 at. % and 20 at. %, and particularly preferably between 4 at. % and 15 at. %.

The surface of the adhesion promoter layer and/or the adhesion promoter layer as a whole preferably have a relatively high proportion of C, which is in particular >50 at. % or >60 at. %. It is preferred that the proportion of C is between 50 at. % and 90 at. %, in particular between 60 at. % and 85 at. %, and particularly preferably between 65 at. % and 85 at. %.

The surface of the adhesion promoter layer and/or the adhesion promoter layer as a whole preferably have a relatively low proportion of O, which is in particular <25 at. % or <20 at. %. It is preferred that the proportion of O is between 5 at. % and 25 at. %, in particular between 10 at. % and 20 at. %.

The surface of the adhesion promoter layer and/or the adhesion promoter layer as a whole preferably consist of:
Si: 3 at. % to 25 at. %, in particular 4 at. % to 20 at. %,
C: 50 at. % to 90 at. %, in particular 60 at. % to 85 at. %,
O: 5 at. % to 25 at. %, in particular 10 at. % to 20 at. %,
    wherein the sum of Si+C+O is preferably >90%, in particular >95% or >98%,
wherein the remainder is preferably H, N and additional elements from the substrate.

The elemental composition of the adhesion promoter layer is determined in particular by means of X-ray photoelectron spectroscopy (ESCA, XPS) at the outermost surface of the layer. The elemental composition can also be measured with higher depth resolution by energy-dispersive X-ray spectroscopy (EDX). Fourier transformation infrared spectrometry (FTIR) can additionally be used for structure clarification, and in particular for identifying functional groups. If the composition of the adhesion promoter layer is not uniform over the layer thickness, for example because the layer has a gradient, the composition in the interior of the layer can be determined, for example, by means of XPS at oblique cuts.

The adhesion promoter layer is preferably covalently bonded to the polymer layer. The covalent bond is preferably produced after the polymer layer, or a polymer compound as a precursor of the polymer layer, has been applied to the adhesion promoter layer. Afterwards, conditions are set in which the polymer layer or the polymer compound forms a covalent bond with the adhesion promoter layer in a chemical reaction.

The covalent bonding of the adhesion promoter layer to the polymer layer preferably takes place via C—C single bonds. The C—C single bonds are preferably produced by functional groups at the surface of the adhesion promoter layer reacting with functional groups of the polymer layer. The functional groups are respectively preferably unsaturated carbon bonds, in particular C—C double bonds. In a particularly preferred embodiment, the polymer compound for producing the polymer layer has unsaturated carbon bonds, in particular double bonds, which are crosslinkable to form carbon single bonds which interconnect the adhesion promoter layer and the polymer layer.

In a preferred embodiment, the polymer layer is obtained by applying a polymer compound to the adhesion promoter layer and crosslinking it, wherein the adhesion promoter layer is also covalently bonded to the polymer layer when the polymer compound is crosslinked.

This means that two reactions run in parallel, namely the crosslinking of the polymer compound to obtain the polymer layer and the reaction leading to a stable covalent bonding of the adhesion promoter layer to the polymer layer. The surface of the adhesion promoter layer and the polymer compound preferably have identical or similar functional groups, in particular unsaturated carbon bonds.

In a preferred embodiment, the crosslinking of the polymer layer is effected by means of vulcanization. The polymer layer is preferably covalently bonded to the adhesion promoter layer. In general, the vulcanization takes place in the presence of reactive auxiliaries and/or catalysts which effect or promote crosslinking. These auxiliaries and/or catalysts may be added to the polymer layer or to the polymer compound prior to curing. Examples of auxiliaries for vulcanization are sulfur, peroxides, metal compounds, in particular metal oxides, silanes, amines, bisphenols, phenolic resins or high-energy radiation. The vulcanization can be induced or accelerated by external influences, for example by the action of heat or radiation.

In a preferred embodiment, the adhesion promoter layer has unsaturated carbon bonds, in particular carbon double bonds or carbon triple bonds, at the surface before application of the polymer layer. In the production of plasma coatings with unsaturated hydrocarbons in the presence of organosilicon compounds, adhesion promoter layers which have unsaturated C—C bonds at the surface can be obtained. In this case, using ethylene or acetylene, as a result of which a relatively high proportion of unsaturated functional groups can be obtained at the surface of the coating, is preferred.

In a preferred embodiment, the polymer compound used to produce the polymer layer is an unsaturated compound containing, in particular, non-aromatic double bonds. Such polymer compounds can be crosslinked relatively well, in particular by means of vulcanization.

In a preferred embodiment, the polymer layer is an elastomeric layer. The modulus of elasticity according to DIN 53457 is preferably less than 3000 N/mm2, in particular less than 2000 N/mm2. The polymer layer is preferably obtainable from a rubber. Rubbers are generally suitable for the production of elastomeric polymers by crosslinking. Rubbers contain double bonds and can therefore be crosslinked easily and, where appropriate, enter into a covalent bond with the adhesion promoter layer.

In a preferred embodiment, the polymer layer comprises a polymeric material selected from fluorine rubber (FKM), ethylene propylene copolymers, such as ethylene propylene diene rubber (EPDM), polyacrylate rubber (ACM), ethylene acrylate rubber (AEM), butadiene rubber, such as acrylonitrile butadiene rubber (NBR), hydrated acrylonitrile butadiene rubber (HNBR), styrene-butadiene rubber (SBR), silicone rubbers, natural rubber (NR), chloroprene rubber (CR), epichlorohydrin rubber (ECO), polyurethane or epoxy polymers. In particular, the polymer layer consists of such polymer materials. These polymers are advantageous because they can be crosslinked relatively easily and be connected to the adhesion promoter layer in the process.

In one embodiment, the polymer layer and/or the substrate do not have any fluoropolymer. In one embodiment, the composite material has no fluoropolymer and/or no components with fluoride groups at all. Preferably, the substrate is not PTFE and/or the composite material does not contain PTFE. In the prior art, coating and in the process activating inert PTFE, which has a low surface energy, in plasma are proposed. It was surprising that stable composite materials can be obtained with the method according to the invention if the substrate or the composite material has no fluoropolymers and in particular no PTFE.

The polymer layer is directly connected to the substrate via the adhesion promoter layer. This means that only the adhesion promoter layer produced in plasma is present between the substrate and the polymer layer.

According to the invention, the substrate, the adhesion promoter layer and the polymer layer are not connected via an additional binder. It is not necessary to connect the polymer layer to the plasma-coated substrate using an additional binder. It was found that a highly stable composite material can be obtained if the polymer layer is applied directly to the adhesion promoter layer. According to the invention, the composite material therefore has no additional binder between the substrate, the polymer layer and the adhesion promoter layer. Gluing is also not required. This is advantageous, because the manufacturing process is relatively simple, as it requires relatively few components and method steps. In addition, the complexity of the composite material would be increased by an additional binder, which leads to more joints and is overall disadvantageous for stability.

In one embodiment of the invention, the composite material has no additional layers on the polymer layer. In this case, the polymer layer forms the outer layer and the surface of the composite material. In a preferred embodiment of the invention, the composite material is designed such that only the polymer layer and the adhesion promoter layer are present on the substrate. In a preferred embodiment of the invention, the composite material consists of the substrate, the polymer layer and the adhesion promoter layer.

In a preferred embodiment, the polymer layer is not an adhesive layer, or an adhesion-promoting layer, that connects the substrate to another additional layer facing away from the substrate. In this case, the polymer layer can be a carrier layer to which at least one further layer is applied. This means that the polymer layer cures after application without being connected to an additional component prior to curing.

In one embodiment, at least one further layer may be present on the polymer layer, i.e., on the side facing away from the substrate. For example, the further layer may be a functional coating, for example for coloring or friction reduction. The at least one additional layer can be applied by means of customary methods, for example by means of wet-chemical coating, such as painting, gluing with an additional adhesive or by means of an additional plasma coating. Preferably, the polymer layer itself is not the adhesion-promoting layer which connects the additional layer to the plasma-coated substrate, but the polymer layer is a carrier layer.

According to the invention, first providing the substrate with the adhesion promoter layer and thereafter applying the polymer layer to the adhesion promoter layer are preferred. The invention also relates to a method for producing a composite material according to the invention, comprising the steps of:

(a) providing the substrate,
(b) coating the substrate with the adhesion promoter layer by plasma-enhanced chemical vapor deposition,
(c) applying a polymer compound to the adhesion promoter layer, and
(d) crosslinking the polymer compound, wherein the adhesion promoter layer is also covalently bonded to the polymer layer.

In doing so, steps (a) to (d) are carried out in the order indicated.

In step (a), a suitable substrate is selected. Generally, the substrate is a molded body that can have any desired shape, such as a rod, ring, plate, or complex component. In this case, the substrate preferably provides the form of the composite material. A metal ring can thus be provided as substrate for producing a seal ring.

In this case, the adhesion promoter layer applied in step (b) preferably has unsaturated carbon bonds at the surface. When crosslinking the polymer compound in step (d), these unsaturated carbon bonds preferably react with the polymer compound, which preferably likewise has reactive groups. This achieves the advantages of a stable layer connection which are described above for the composite material according to the invention.

In general, in step (b), the adhesion promoter layer can be applied to the substrate by reaction in plasma according to known methods. In this respect, reference is made to the prior art which is discussed in the introduction and which describes by way of example how plasma layers of hydrocarbons, silanes, siloxanes or mixtures of precursor compounds are produced. Generally, the substrate is first cleaned and introduced into a suitable plasma device. Usually, a non-layer-forming pretreatment in a plasma gas, which does not contain layer-forming precursor compounds, first takes place in the device, for example in the presence of noble gases, oxygen or nitrogen. In this case, the substrate can be cleaned again and optionally be activated at the surface. Suitable precursor compounds are subsequently introduced in the gas phase and plasma-enhanced chemical vapor deposition is carried out. The thickness, composition and growth of the layer can be controlled by known measures, for example by varying the amount and concentration of the precursor compounds, the temperature, the process power, the pressure, the coating time, the supply of inert gas and other parameters. After formation of the desired coating, the PE-CVD process is stopped, for example by removing the substrate from the device or by interrupting the power input or the inflow of precursor compounds. Corresponding methods and modifications are known and sufficiently described in the literature. By way of example only, reference is made in this respect to the textbook "Advanced Plasma Technology," d'Agostino et al. (editor), Wiley-VCH (publisher), 2008.

With the method according to the invention, it is advantageous that a uniform, thin and stable adhesion promoter layer can be produced in plasma with little material use. In contrast, in known wet-chemical processes, immersion baths or spray methods are used, and a relatively thick adhesion promoter layer has to be produced in order to uniformly and completely coat the substrate. This consumes relatively large amounts of binder, which is undesirable for economic and ecological reasons.

The polymer layer can be applied in step (c) according to customary methods. In this case, it is preferred that a polymer compound is not applied in solid form, and in particular in liquid, pasty or highly viscous form, and subsequently solidifies to form the polymer layer. The polymer compound is applied in particular as a melt or mixture with a solvent. Solidification is effected by curing and/or crosslinking. The liquid, pasty or highly viscous polymer compound can be applied according to customary shaping methods, for example by injection molding, compression molding or transfer molding. In this case, the substrate with the adhesion promoter layer from step (b) is preferably added to a mold. In this case, a molding compound is injected into a chamber onto the coated substrate, in which chamber it crosslinks or cures under heat and pressure. The method is particularly suitable for producing elastomer components, such as seals. During curing under heat and pressure, covalent bonds of the polymer layer to the adhesion promoter layer can be formed in parallel.

In step (c), the polymer layer is applied directly to the adhesion promoter layer. The use of an additional binder is therefore not required. This is advantageous because the complexity of the system and of the method is reduced and the known problems with the use of binders, such as uniform application and high material consumption as a result of immersion baths and spray methods, are avoided.

In a preferred embodiment, the polymer layer and the polymer compound may contain additives. Additives which promote curing, such as crosslinking auxiliaries and catalysts for vulcanization, are particularly preferred. Sulfur, peroxides, metal compounds, in particular metal oxides, silanes, amines, bisphenols or phenolic resins can in particular be contained as crosslinking auxiliaries. The polymer layer may also contain conventional additives which modify the properties in the desired manner, such as fillers, processing aids, binding aids, light stabilizers or dyes. Fillers which may be contained are, for example, mineral fillers, silicas or carbon black.

The invention also relates to the use of an adhesion promoter layer for connecting the substrate to a polymer layer. The adhesion promoter layer is obtainable by means of PE-CVD, which is carried out with a mixture of precursor compounds containing at least one unsaturated hydrocarbon and at least one organosilicon compound. Use is made in particular with the composite materials according to the invention.

The composite materials according to the invention are characterized by a high degree of stability. The substrate can only be detached from the polymer layer by means of strong mechanical forces. The composite materials can therefore be used for applications with which strong mechanical forces act on the materials. Alternatively, applications in contact with material-consuming and/or aggressive liquid media may be advantageous.

The composite materials are preferably characterized by a high adhesive force or adhesive strength. Thus, preferably high separating forces are required in order to detach the polymer layer from the substrate. The adhesive strength of layer materials is preferably determined according to ASTM D429. The adhesive strength of polymer layers on metals is preferably determined in the 90° peel test based on method B. The separating force is preferably greater than 2 N/mm, in particular greater than 5 N/mm, particularly preferably greater than 7.5 N/mm, more preferably greater than 10

N/mm. A failure image in the elastomer material, i.e., in the polymer layer (failure image R according to the exemplary embodiments), and not a detachment of the layers from one another, preferably arises.

The invention also relates to the use of the composite material according to the invention as a sealing article or for producing a sealing article. Given their high degree of stability, the composite materials according to the invention are particularly suitable as sealing articles. Sealing articles must provide a constant sealing effect over long periods of time at high mechanical loads. For this purpose, sealing articles, for example made of metal, are often provided with coatings which modify the stability, the deformability or the wettability with sealants. There is a high need for sealing articles which, even in prolonged use, are not changed by abrasion, cracks or other mechanical damages.

The invention also relates to a sealing article which contains or consists of a composite material according to the invention. The sealing article may be a static or a dynamic sealing article. Static seals are, for example, springs, flange seals, plug connections (e.g., Plug & Seal), metal O-rings, valves, liquid seals or integrated static seals on metallic substrates (e.g., elastomer seals on metallic bipolar plates for fuel cell applications). Dynamic seals, such as rotary seals, serve to seal moving machine parts which have a common, moving interface. In a dynamic seal, the sealing elements move relative to one another. In a rotary seal, the relative movement of the sealing elements is rotatory. A dynamic seal is characterized by a considerable movement of this interface, which is absent in static seals. The typical application of a rotary seal is the sealing of a rotating shaft against a stationary housing.

The sealing article is preferably a mechanical seal, a radial shaft seal ring, an axial shaft seal ring, a labyrinth shaft seal, a flat seal, a piston ring, a spring or a special seal.

The composite materials according to the invention are particularly suitable for sealing articles because they are exceptionally stable and durable on the one hand and can contain various, very different materials on the other hand. The high degree of stability is advantageous because sealing elements are often permanently exposed to high mechanical loads, which can lead to abrasion and damages, in particular during longer operating times. The ability to combine different materials is advantageous because sealing materials often have a soft, adjustable polymer component and a hard or rigid component, for example a metal core, which must be interconnected in a stable and durable manner.

The composite material is also suitable for further applications with which stable coatings and the ability to combine different materials, such as magnet armatures, bellows or membranes, are important.

The composite materials, methods and uses according to the invention achieve the object underlying the invention. Composite materials, with which a plurality of different substrates can be stably and permanently connected to different further materials, are provided. In particular, the invention enables a stable connection of metals to polymers or of different polymers to one another. The composite materials consist of conventional components. They are obtainable by relatively simple processes in a few steps. The adhesion promoter layers based on unsaturated hydrocarbons and organosilicon compounds adhere well to a plurality of different substrates and enable a stable connection to a plurality of additional, different materials.

EXEMPLARY EMBODIMENTS

Production of the Coating

Various base bodies are provided with a coating in a plasma-enhanced chemical vapor deposition process. For this purpose, a low-pressure plasma system is used for an asymmetric, capacitively coupled radio-frequency discharge. The base bodies (substrates) are positioned on the electrode in contact therewith. In this process, acetylene or ethylene are used as a carbon source and substantial layer-forming precursor compound and an alkylsilane compound or siloxane compound is optionally used as organosilicon compound. The addition of further reactive gases, for example oxygen, argon, nitrogen, is also possible. These gases are put into the plasma state at process pressures of a few pascals through excitation with electromagnetic radiation, for example at radio frequency. The molecules are cleaved and condense at the surface of the base body as a carbon-rich layer, which is provided with a silicon proportion when the organosilicon compound is additionally used. For better bonding of the layer to the base bodies, the base bodies are first activated in a non-layer-forming plasma, for example consisting of argon and/or oxygen. In the process, depending on the nature of the base body surface, fragments from the surface can transition into the plasma phase and can also be incorporated into the coating.

In principle, it is possible and also common practice to combine a plurality of process sections into an overall process. For example, the process gas compositions can be varied over the course of the process and the local layer composition can be influenced gradually or in steps.

Unless specified further, stainless steel substrates (polished, degreased stainless steel strips of type 1.4016 having dimensions width×length 20 mm×100 mm) are used in the following exemplary embodiments.

The following sealing materials are applied as polymer components to the adhesion promoter layers described:

TABLE 1

SEALING MATERIALS USED

| Designation | Polymer | Crosslinking mechanism | Main filler |
| --- | --- | --- | --- |
| FKM I | Fluorocarbon rubber | Bisphenol | Carbon black |
| FKM II | Fluorocarbon rubber | Peroxide | Little filler |
| EPDM I | Ethylene propylene diene rubber | Peroxide | Carbon black |
| HNBR I | Hydrated acrylonitrile butyl rubber | Peroxide | Carbon black |
| ACM I | Acrylic rubber | Sulfur soap | Carbon black |

Examples 1 and 2: Stainless Steel Strips with DLC and Si-DLC Layers

Figure 1B:
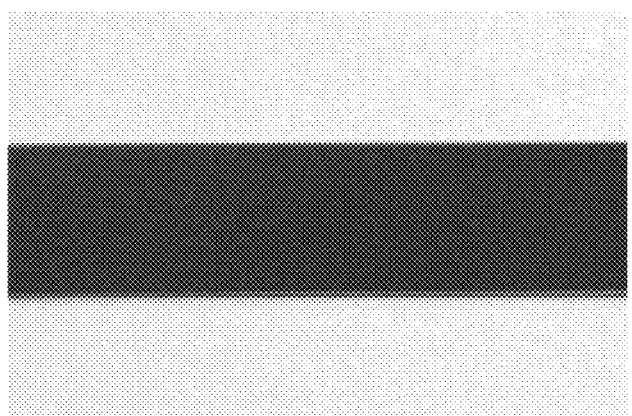

Polished stainless steel substrates are cleaned with ethanol and coated in the plasma process described above. To this end, the substrates are first activated in a non-layer-forming argon plasma (process gas flow: 80 sccm argon, process power: 300 W) before the layer-forming processes are initiated. Layer system I (Example 1, comparison) is deposited from a pure hydrocarbon process (process gas flow: 60 sccm acetylene, process power: 400 W). Layer system II (Example 2) consists initially of an organosilicon-enriched layer (process gas flow: 30 sccm HMDSO; process power: 400 W) which then gradually transitions into a carbon-rich layer (process gas flow: 60 sccm acetylene, process power:

400 W). Photographs of the test specimens are shown in FIG. 1. The layer system I is not stable on stainless steel and flakes off, so that the light-colored stainless steel substrate with residues of the detached, darker coating can be seen (FIG. 1a). In contrast, layer system II is stable so that the dark coating completely covers the substrate (FIG. 1b). High stresses in the coating lead to layer failure and delamination. The stresses are reduced and stable coatings are produced through the incorporation of Si functionalities.

Examples 3 and 4: Comparison of Layer Systems I and II in a Sealing Product

Figure 2A:
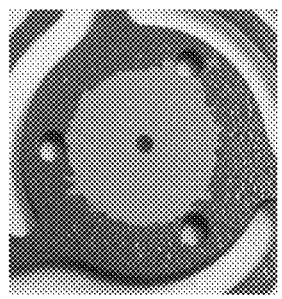
FIGS. 2a and 2b show photographs of the special seal according to Examples 3 (comparison, FIG. 2a) and 4 (FIG. 2b) provided with adhesion promoter layers and elastomer layers.
Figure 2B:
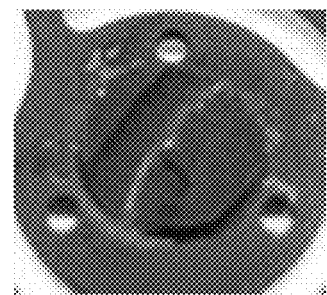

A metallic base body of a special seal (meander spring, polished, degreased stainless steel) is provided with the layer systems described in Examples 1 and 2. Afterwards, FKM I is partially applied in a transfer molding process and vulcanized. The adhesion of the elastomer component to the base body is checked manually by pushing off the coating using a tool in parallel to the adhesive surface. With the composite with layer system I (Example 3, comparison), the elastomer component can be removed easily. The composite fails in the interface between the adhesion promoter layer and the metal base body, wherein the adhesion promoter layer remains on the elastomer. With the composite with layer system II (Example 4), the elastomer component cannot be pushed off. The elastomer adheres to the base surface and fails in the material. FIG. 2 shows photographs of the stainless steel components according to Examples 3 (FIG. 2a) and 4 (FIG. 2b). FIG. 2b shows the component according to the invention with the stable elastomer layer (dark, central) applied thereon. In contrast, FIG. 2a shows that the elastomer has detached from the light-colored base body in Comparative Example 3.

Examples 5 Through 10: Comparison of Adhesion Promotion to HNBR Elastomer

Metallic base bodies made of stainless steel are coated with the layer systems described in Example 1. The layer systems III to V are also produced. Layer system III, similarly to system II, consists of an organosilicon-enriched layer (process gas flow: 90 sccm TMS; process power: 400 W) which then gradually transitions into a carbon-rich layer (process gas flow: 60 sccm acetylene, process power: 400 W). Layer system IV is based on system II, but 100 sccm of oxygen are additionally admixed. Layer system V uses ethylene as carbon donor instead of acetylene at otherwise identical process conditions (process gas flow: 60 sccm ethylene).

After the application of the layer systems to the base bodies, they are provided with a layer of HNBR I in a compression molding process (CM process). For this purpose, the unvulcanized elastomer mixture is applied to the metal strips and vulcanized under pressure and at temperature to the coated base body (process conditions: T=180° C., p=230 bar, t=5 min). After the vulcanization process and after subsequent heating for complete crosslinking of the elastomer, test specimens are punched out of the cooled elastomer plate and ground. A specimen consisting of a rigid, metallic base body, a plasma adhesion promoter layer and a 4 mm thick elastomer coating vulcanized thereon are produced for the peel test.

In order to evaluate the composite, a 90° peel test based on ASTM D429 Method B is carried out. The test speed is 100 mm/min. Separating forces are measured in N/mm. In addition to the separating forces, the failure image is also indicated. R designates a failure in the elastomer, RC designates the failure between elastomer and adhesion promoter, MC designates the failure between metal and adhesion promoter, and MR designates the failure between metal and elastomer. In addition to the failure image R, a number that describes the failure image more precisely may be indicated. In this case, 100 stands for 100%. Thus, R100 denotes a remaining elastomer layer with 100% coverage on the adhesion promoter; i.e., the crack passes completely through the elastomer. Such a failure image corresponds to the maximum requirements, because the adhesion between elastomer and rigid substrate (metal or plastic) is greater than the cohesion of the elastomer in this case.

The results are summarized in Table 2. They show that the test specimens with the adhesion promoter layers produced according to the invention have high degrees of stability. It is particularly advantageous that the failure profile R100 is reached, which corresponds to the maximum requirements. In contrast, the test specimens according to the Comparative Examples, which do not have an adhesion promoter layer or an adhesion promoter layer consisting of only DLC, are unstable.

TABLE 2

PEEL TEST OF STAINLESS STEEL HNBRI COMPOSITES

| Example | Adhesive layer | Precursor compound | Separating forces [N/mm] | Failure image |
|---|---|---|---|---|
| 5 (comparison) | None | — | 0 | MR |
| 6 (comparison) | I | Acetylene | 0 | RC |
| 7 | II | HMDSO + acetylene | 6.4 | R100 |
| 8 | III | TMS + acetylene | 5.6 | R100 |
| 9 | IV | HMDSO + acetylene + O2 | 5.9 | R100 |
| 10 | V | HMDSO + ethylene + O2 | 4.2 | R100 |

Examples 11 Through 13: Comparison of Adhesion Promotion to FKM II Elastomer

Analogously to the procedure in the previous example, base bodies made of stainless steel are provided with the layer systems I and II. FKM II is used as elastomer component for the peel test specimens this time. The adhesion is tested and evaluated in a manner analogous to the previous example.

The results are summarized in Table 3. They show that the test specimen with the adhesion promoter layer produced according to the invention has a high degree of stability. In contrast, the test specimens according to the Comparative Examples, which do not have an adhesion promoter layer or an adhesion promoter layer consisting of only DLC, are unstable.

TABLE 3

PEEL TEST OF STAINLESS STEEL FKMII COMPOSITES

| Example | Adhesive layer | Precursor compound | Separating forces [N/mm] | Failure image |
|---|---|---|---|---|
| 11 (comparison) | None | — | 0 | MR |
| 12 (comparison) | I | Acetylene | 0 | MC |
| 13 | II | HMDSO + acetylene | 12.1 | R100 |

Examples 14 Through 26: Adhesion with Various Adhesion Promoter Layers and Elastomers Metallic base bodies made of stainless steel are coated with various Si-hydrocarbon layer systems for adhesion promotion. As already described, layer system II initially consists of an organosilicon-enriched layer (process gas flow: 30 sccm HMDSO; process power: 400 W) which then gradually transitions into a carbon-rich layer (process gas flow: 60 sccm acetylene, process power: 400 W). Layer system VI is based on the same process parameters, but the organosilicon content in the process gas mixture is kept constant until process end. In layer system VII, the organosilicon precursor is lowered to 4 sccm in the last phase of the process with otherwise identical process parameters. For comparison, layer system VIII which is also based on layer system II is also analyzed. Here, however, only HMDSO is used as a precursor; the remaining process parameters correspond to layer system II. From the base bodies produced in this way, test specimens with various mixtures are subsequently produced and characterized in 90° peel tests analogously to the examples described above.

The results are summarized in Table 4. They show that the test specimens with the adhesion promoter layers produced according to the invention have high degrees of stability. In contrast, the test specimens according to the Comparative Examples, which do not have an adhesion promoter layer, an adhesion promoter layer consisting of only DLC or an adhesion promoter layer consisting of only HMDSO, are unstable or show no adhesion between metal and elastomer.

TABLE 4

PEEL TEST OF STAINLESS STEEL ELASTOMER COMPOSITES

| Example | Adhesive layer | Precursor compound | Mixture | Separating forces [N/mm] | Failure image |
|---|---|---|---|---|---|
| 14 (comparison) | None | — | FKM I | 0 | MR |
| 15 | II | HMDSO + acetylene | FKM I | 7.7 | R100 |
| 16 | VI | HMDSO + acetylene | FKM I | 6.6 | R100 |
| 17 | VII | HMDSO + acetylene | FKM I | 7.5 | R100 |
| 18 (comparison) | VIII | HMDSO | FKM I | 0 | RC |
| 19 (comparison) | None | — | FKM II | 0 | MR |
| 20 | II | HMDSO + acetylene | FKM II | 12.1 | R100 |
| 21 | VI | HMDSO + acetylene | FKM II | 9.1 | R100 |
| 22 | VII | HMDSO + acetylene | FKM II | 8.4 | R100 |
| 23 (comparison) | None | — | EPDM I | 0 | MR |
| 24 | II | HMDSO + acetylene | EPDM I | 2.8 | R100 |
| 25 | VI | HMDSO + acetylene | EPDM I | 3.4 | R100 |
| 26 | VII | HMDSO + acetylene | EPDM I | 3.3 | R100 |

Examples 27 Through 40: Adhesion of Si-DLC to Metal and Plastic Substrates

Different substrates are provided with the Si-doped hydrocarbon layers. The preceding activation process is the same in all cases. Aluminum (Al 99,5) and steel (DD11) in the dimensions of the previously used stainless steel substrates are used as metallic substrates. In addition, the following plastic substrates (width×length: 25 mm×100 mm) are used: polyamide 6.6 (PA66), polyamide 6.6 with 30% glass fiber filling (PA66GF30) and polyphenylene sulfide with 40% glass fiber filling (PPSGF40). After coating, peel test specimens are produced and tested as in the previously described exemplary embodiments. FKMI is used as elastomer component.

The results are summarized in Table 5. They show that the test specimens with the adhesion promoter layers produced according to the invention have high degrees of stability, both on metals and on plastics. In contrast, the test specimens according to the Comparative Examples, which do not have an adhesion promoter layer or an adhesion promoter layer consisting of only DLC, are unstable.

TABLE 5

PEEL TEST OF VARIOUS PLASTIC OR METAL FKMI COMPOSITES

| Example | Adhesive layer | Precursor compound | Substrate | Separating forces [N/mm] | Failure image |
|---|---|---|---|---|---|
| 27 (comparison) | None | — | DD11 | 0 | MR |
| 28 | II | HMDSO + acetylene | DD11 | 8.1 | R100 |
| 29 | VI | HMDSO + acetylene | DD11 | 8.1 | R100 |
| 30 | VII | HMDSO + acetylene | DD11 | 8.3 | R100 |
| 31 (comparison) | None | — | PPSGF40 | 0 | MR |
| 32 | II | HMDSO + acetylene | PPSGF40 | 5.9 | R100 |
| 33 | VI | HMDSO + acetylene | PPSGF40 | 6.4 | R100 |
| 34 | VII | HMDSO + acetylene | PPSGF40 | 6.3 | R100 |
| 35 (comparison) | None | — | Al 99.5 | 0 | MR |
| 36 | II | HMDSO + acetylene | Al 99.5 | 6.7 | R100 |

TABLE 5-continued

PEEL TEST OF VARIOUS PLASTIC OR METAL FKMI COMPOSITES

| Example | Adhesive layer | Precursor compound | Substrate | Separating forces [N/mm] | Failure image |
|---|---|---|---|---|---|
| 37 (comparison) | None | — | PA66 | 0 | MR |
| 38 | II | HMDSO + acetylene | PA66 | 6.4 | R100 |
| 39 (comparison) | None | — | PA66GF30 | 0 | MR |
| 40 | II | HMDSO + acetylene | PA66GF30 | 5.7 | R100 |

Examples 41 and 42: Adhesion of Si-DLC in PTFE-ACM Composites

Analogously to the preceding examples, thermoplast-elastomer peel strips are produced. PTFE with 25% glass fibers (dimensions width×length 25 mm×100 mm) is used as the plastic substrate. Layer system II is used as adhesion promoter, and ACM I (polyacrylate rubber) is used as elastomer. The remaining procedure corresponds to that described above, except that the peel strips are no longer post-heated after vulcanization.

The results are summarized in Table 6. They show that the test specimen with the adhesion promoter layer produced according to the invention has a high degree of stability. In contrast, the test specimen according to Comparative Example 41, which does not have an adhesion promoter layer, is unstable. As shown in Comparative Example 41b, the layer VIII produced with HMDSO also does not impart adhesion between the PTFE and the ACM.

TABLE 6

PEEL TEST OF PTFE ACM COMPOSITES

| Example | Adhesive layer | Precursor compound | Separating forces [N/mm] | Failure image |
|---|---|---|---|---|
| 41 (comparison) | None | — | 0 | MR |
| 41b (comparison) | VIII | HMDSO | 1.4 | RC |
| 42 | II | HMDSO + acetylene | 4.2 | R100 |

Example 43: Media Stability of the Adhesive Composites (Water Storage)

Analogously to the preceding examples, peel test specimens are produced from stainless steel and FKM I and from stainless steel and EPDM I. Layer system II functions as adhesion promoter. Prior to the peel test, the test specimens are stored in water at 60° C. for 72 hours. In the subsequent peel test, the test specimens have comparable stability to the unstored counterparts, with failure image R100 in the elastomer. The experiments show that the composite material has high durability.

Example 44: Media Stability of the Adhesive Composites (Atmospheric Humidity)

Analogously to the preceding examples, peel test specimens are produced from stainless steel and FKM I and from stainless steel and EPDM I. Layer system II functions as adhesion promoter. Prior to the peel test, the test specimens are stored in 100% atmospheric humidity at 60° C. for 72 hours. In the subsequent peel test, the test specimens have comparable stability to the unstored counterparts, with failure image R100 in the elastomer. The experiments show that the composite material has high durability.

Example 45: Media Stability of the Adhesive Composites (Plasticizers)

Analogously to the preceding examples, peel test specimens are produced from stainless steel and FKM I and from stainless steel and EPDM I. Layer system II functions as adhesion promoter. Prior to the peel test, the test specimens are stored in a plasticizer (dioctyl sebacate) at 80° C. for 168 hours. In the subsequent peel test, the test specimens have comparable stability to the unstored counterparts, with failure image R100 in the elastomer. The experiments show that the composite material has high durability.

Example 46: Gluing PTFE

Unfilled PTFE test specimens (dimensions width×length 25 mm×100 mm) are pretreated with layer system II and subsequently glued to shear test specimens with a heat-curing epoxy adhesive (DELO MONOPOX HT2860); the overlap width is 25 mm, and the overlap length 12.5 mm in this case. The adhesive is cured at 150° C. for 55 min. Shear testing takes place according to DIN EN 1465 in the cooled state. The test speed is 30 mm/min. All test specimens were stable and failed in the peel test in the PTFE or between PTFE and adhesion promoter layer. For comparison purposes, shear test specimens are also produced from PTFE strips without adhesion promoter layers. No adhesion could be produced here and thus no testing could be carried out.

Example 47: Chemical Functionalities in the Coatings (FTIR Spectra and Raman Analysis)

Figure 3:
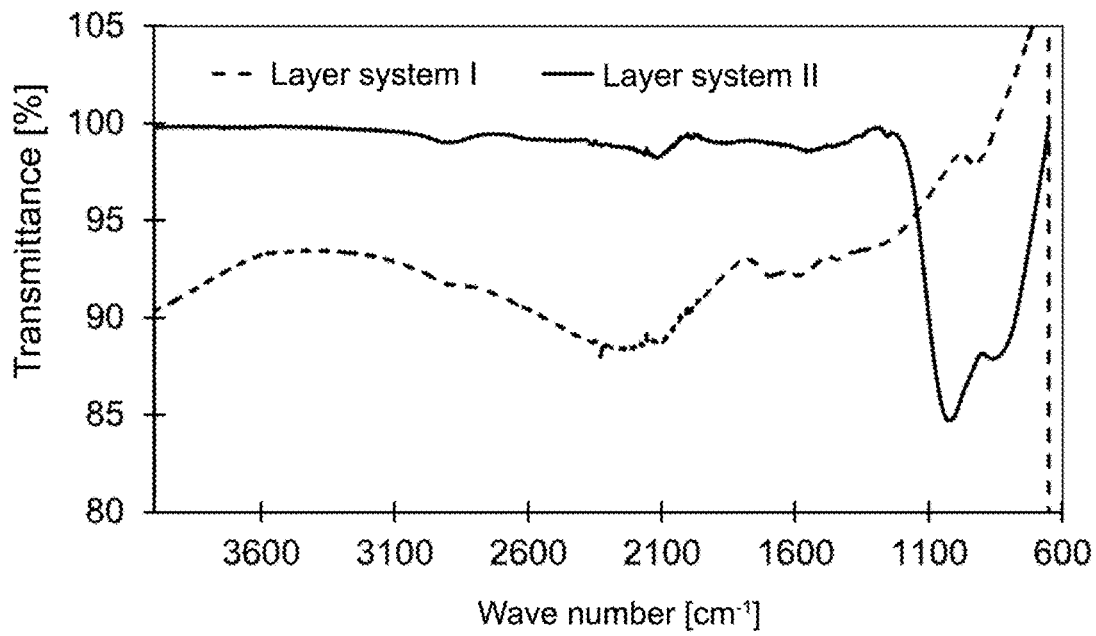
FIG. 3 shows IR spectra of layer systems I and II measured according to Example 47.

The layer systems from Examples 1 and 2 are deposited on aluminum foil and characterized by FTIR (ATR mode, germanium crystal) with regard to their chemical functionality. The sensitivity of this method includes the first microns of a surface; i.e., portions of the substrate are likely to appear in the spectrum. However, since the substrate differs markedly chemically from the coatings, these proportions should be negligible. The IR spectra are shown in FIG. 3. It can be seen from both spectra that the bands described in WO 01/61069 A2 around 3300 cm$^{-1}$ are not distinct. This is due to the highly crosslinked and slightly ordered structure of the DLC layer. In addition, in contrast to layer system I, layer system II has distinct organosilicon proportions in the layer (see signal around about 800 and 1000 cm$^{-1}$ respectively). The embedding DLC matrix is less specifiable in the IR spectrum.

In addition, the layer system II is analyzed for its sp$^2$ content by means of Raman in order to characterize the carbon bonding environment more accurately. On average, the graphite content is 62%. A significant proportion of the carbon atoms thus has double bonds.

Example 48: Chemical Functionalities in the Si-DLC Coatings (FTIR Measurements)

Figure 4:
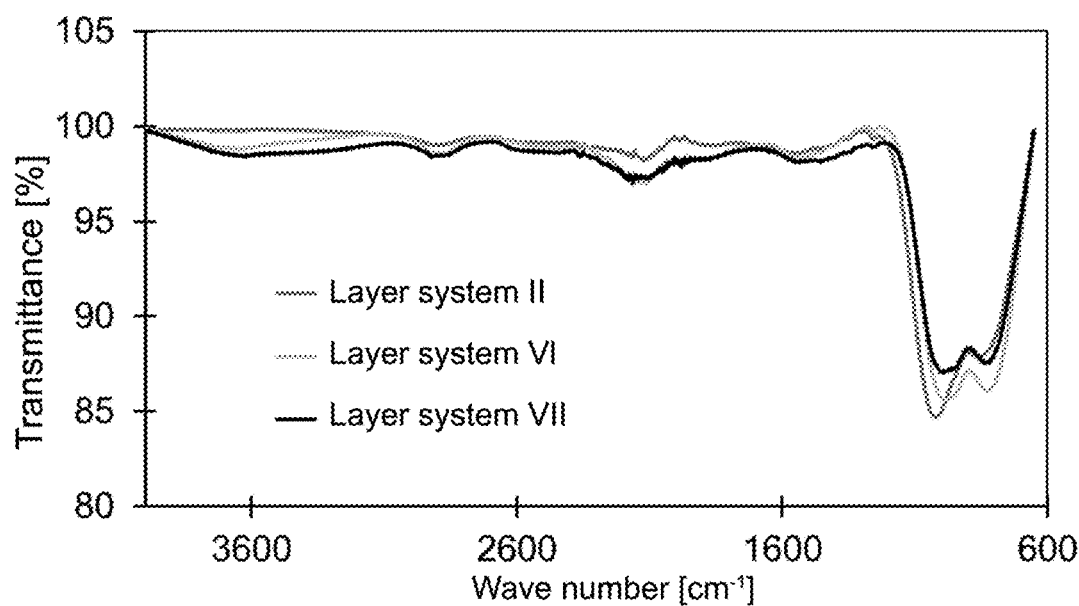
FIG. 4 shows IR spectra of layer systems II, VI and VII measured according to Example 48.

Analogously to the preceding example, the layer systems VI and VII, which were produced as described above, are analyzed by means of FTIR. Here as well, irrespective of the configuration of the layer system, the organosilicon content is clearly recognizable in the coating (FIG. 4). The layer systems with continuous siloxane addition to the process gas mixture tend to have a higher proportion of Si—C bonds, whereas system II has somewhat more Si—O bonds.

Example 49: Chemical Composition of Si-DLC Coatings (XPS Measurements)

The layer systems from the preceding example are additionally analyzed by means of X-ray photoelectron spectroscopy (XPS). This method is significantly more sensitive than FTIR and analyzes only the uppermost nanometers (up to 10 nm) which are in direct contact with the phase to be bonded, but in no way the complete coating. The following compositions are obtained:

TABLE 7

CHEMICAL COMPOSITION OF THE ADHESION PROMOTER SURFACES

| Adhesive layer | Proportion of Si [at. %] | Proportion of C [at. %] | Proportion of O [at. %] | Proportion of others [at. %] |
|---|---|---|---|---|
| I | 0.6 | 90.2 | 9.2 | |
| II | 4.9 | 81.6 | 13.4 | 0.2 |
| VI | 14.8 | 66.8 | 18.3 | 0.2 |
| VII | 6.2 | 79.0 | 14.8 | 0.1 |

Example 50: Shaft Seal Ring

A radial shaft seal ring of type BA (inner diameter 72.0, outer diameter 90.0, width 10.0) is produced from a metal ring made of stainless steel and FKM II as an elastomer component. With the exception of a cleaning, the metal rings are not further pretreated prior to the coating and are subsequently provided with the layer systems II (HMDSO+acetylene) and VI (HMDSO+acetylene). They are subsequently placed in a shaping tool. In the compression molding process, the elastomer component is then connected to the coated metal ring and the finished product is formed. The adhesion test is carried out manually by partially peeling off the vulcanized rubber component from the metallic base body using tongs. In order to classify the failure image, it is estimated to what percentage a crack has taken place in the elastomer or how high the coverage of the metal surface is. Failure images with at least 70% elastomer coating are classified as "OK." Metal surfaces with less elastomer coating, i.e., more exposed metal or adhesion promoter, are assessed as "not OK." Both adhesion promoter systems are assessed as OK in this test. The failure thus largely occurs in the elastomer; the adhesion of the elastomer to the metallic substrate is thus greater than the cohesion of the rubber. The result shows that the composite materials according to the invention are highly suitable for the production of stable sealing articles.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A composite material, comprising:
a substrate and a polymer layer which are directly interconnected by an adhesion promoter layer,
wherein the substrate comprises a molded body and a surface of the substrate that directly contacts the adhesion promoter layer comprises a material selected from the group consisting of steel, stainless steel, iron, brass, elemental aluminum, elemental silicon, thermoplastic polymer, and thermoset polymer,
wherein the adhesion promoter layer is obtained by plasma-enhanced chemical vapor deposition (PE-CVD) at least partially using a mixture of precursor compounds containing an unsaturated hydrocarbon and an organosilicon compound,
wherein a surface of the adhesion promoter layer to which the polymer layer is directly connected has a proportion of C which is >50 at. %, as determined by X-ray photoelectron spectroscopy, and
wherein the polymer layer is obtained by applying a polymer compound to the adhesion promoter layer and crosslinking the polymer compound to form the polymer layer.

2. The composite material according to claim 1, wherein the organosilicon compound comprises a siloxane, silane, or silicate.

3. The composite material according to claim 2, wherein the siloxane comprises hexamethyldisiloxane, and/or wherein the silane comprises tetramethylsilane.

4. The composite material according to claim 1, wherein the unsaturated hydrocarbon comprises ethylene or acetylene.

5. The composite material according to claim 1, wherein the adhesion promoter layer is formed as a gradient layer, and
wherein in the gradient layer, a proportion of carbon increases toward the polymer layer and a proportion of Si decreases toward the polymer layer.

6. The composite material according to claim 1, wherein the adhesion promoter layer is covalently bonded to the polymer layer.

7. The composite material according to claim 1, wherein the surface of the adhesion promoter layer and/or the adhesion promoter layer as a whole comprises:
Si: 3 at. % to 25 at. %,
C: 50 at. % to 90 at. %,
O: 5 at. % to 25 at. %.

8. The composite material according to claim 1, wherein the polymer layer comprises a polymer selected from fluorine rubber; ethylene propylene copolymers comprising ethylene propylene diene rubber, polyacrylate rubber, or ethylene acrylate rubber; butadiene rubber comprising acrylonitrile butadiene rubber, hydrated acrylonitrile butadiene rubber, styrene-butadiene rubber, silicone rubbers, natural rubber, chloroprene rubber, or epichlorohydrin rubber; polyurethane; or epoxy polymers.

9. The composite material according to claim 1, wherein the substrate is not a fluoropolymer.

10. The composite material according to claim 1, wherein the adhesion promoter layer has a thickness of 30 nm to 10 μm.

11. A sealing article, comprising:
the composite material according to claim 1.

12. A method for producing the composite material according to claim 1, comprising the steps of:
(a) providing the substrate;
(b) coating the substrate with the adhesion promoter layer by plasma-enhanced chemical vapor deposition (PE-CVD);
(c) applying a polymer compound to the adhesion promoter layer; and
(d) crosslinking the polymer compound,
wherein the adhesion promoter layer is covalently bonded to the polymer layer.

13. The method according to claim 12, wherein when the polymer compound is crosslinked in step (d), unsaturated carbon bonds at a surface of the adhesion promoter layer react with the polymer compound.

14. A method of using the composite material according to claim 1, comprising:
providing the composite material as a sealing article, or using the composite material to produce a sealing article.

15. The composite material according to claim 7, wherein the surface of the adhesion promoter layer and/or the adhesion promoter layer as a whole comprises:
Si: 4 at. % to 20 at. %,
C: 60 at. % to 85 at. %,
O: 10 at. % to 20 at. %.

16. The composite material according to claim 15, wherein a sum of Si+C+0 in at least one of the surface of the adhesion promoter layer and the adhesion promotor layer as a whole is >90%, and
wherein a remainder is H, N, and additional elements from the substrate.

17. The composite material according to claim 7, wherein a sum of Si+C+0 in at least one of the surface of the adhesion promoter layer and the adhesion promotor layer as a whole is >90%, and
wherein a remainder is H, N, and additional elements from the substrate.

18. The composite material according to claim 1, wherein the adhesion promoter layer as a whole has a proportion of C which is >50 at. %.

* * * * *